US011618798B2

(12) United States Patent
Steinhardt et al.

(10) Patent No.: US 11,618,798 B2
(45) Date of Patent: *Apr. 4, 2023

(54) QUASICRYSTALLINE STRUCTURES AND USES THEREOF

(71) Applicant: THE TRUSTEES OF PRINCETON UNIVERSITY, Princeton, NJ (US)

(72) Inventors: Paul Joseph Steinhardt, Princeton, NJ (US); Paul Michael Chaikin, New York, NY (US); Weining Man, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 365 days.

This patent is subject to a terminal disclaimer.

(21) Appl. No.: 17/064,955

(22) Filed: Oct. 7, 2020

(65) Prior Publication Data
US 2021/0070905 A1 Mar. 11, 2021

Related U.S. Application Data

(63) Continuation of application No. 16/287,421, filed on Feb. 27, 2019, now Pat. No. 10,882,938, which is a
(Continued)

(51) Int. Cl.
*H01L 33/00* (2010.01)
*B82Y 20/00* (2011.01)
(Continued)

(52) U.S. Cl.
CPC ............ *C08F 220/56* (2013.01); *B82Y 20/00* (2013.01); *B82Y 30/00* (2013.01);
(Continued)

(58) Field of Classification Search
CPC .... C08F 220/56; C08F 222/385; B82Y 20/00; B82Y 30/00; G02B 6/1225; B33Y 80/00; C08G 59/245; C08G 65/22; H01L 33/002
See application file for complete search history.

(56) References Cited

U.S. PATENT DOCUMENTS

| 5,187,461 A | 2/1993 | Brommer et al. ......... 333/219.1 |
| 5,365,541 A | 11/1994 | Bullock ........................ 372/99 |

(Continued)

FOREIGN PATENT DOCUMENTS

WO WO 01/77726 10/2001

OTHER PUBLICATIONS

Chang, et al., "Fabrication of photonic bandgap structures with designed defects by edge diffraction lithography." *Nanotechnology* 17(5):1333-1338 (2006).
(Continued)

*Primary Examiner* — Bijan Ahvazi
(74) *Attorney, Agent, or Firm* — Medlen & Carroll, LLP

(57) ABSTRACT

This invention relates generally to the field of quasicrystalline strictures. In preferred embodiments, the stopgap structure is more spherically symmetric than periodic structures facilitating the formation of stopgaps in nearly all directions because of higher rotational symmetries. More particularly, the invention relates to the use of quasicrystalline structures for optical, mechanical, electrical and magnetic purposes. In some embodiments, the invention relates to manipulating, controlling, modulating and directing waves including electromagnetic, sound, spin, and surface waves, for pre-selected range of wavelengths propagating in multiple directions.

2 Claims, 4 Drawing Sheets

Related U.S. Application Data continuation of application No. 15/410,396, filed on Jan. 19, 2017, now Pat. No. 10,246,539, which is a continuation of application No. 14/059,003, filed on Oct. 21, 2013, now Pat. No. 9,567,420, which is a continuation of application No. 13/906,792, filed on May 31, 2013, now Pat. No. 8,599,472, which is a continuation of application No. 13/553,149, filed on Jul. 19, 2012, now Pat. No. 8,508,838, which is a continuation of application No. 13/271,969, filed on Oct. 12, 2011, now Pat. No. 8,243,362, which is a continuation of application No. 11/988,480, filed as application No. PCT/US2006/026430 on Jul. 7, 2006, now Pat. No. 8,064,127.

(60) Provisional application No. 60/697,829, filed on Jul. 8, 2005, provisional application No. 60/697,872, filed on Jul. 8, 2005.

(51) Int. Cl.

| | | |
|---|---|---|
| *B82Y 30/00* | (2011.01) | |
| *C08F 220/56* | (2006.01) | |
| *G02B 6/122* | (2006.01) | |
| *C08F 222/38* | (2006.01) | |
| *C08G 65/22* | (2006.01) | |
| *C08G 59/24* | (2006.01) | |
| *B33Y 80/00* | (2015.01) | |

(52) U.S. Cl.
CPC ........ *C08F 222/385* (2013.01); *C08G 59/245* (2013.01); *C08G 65/22* (2013.01); *G02B 6/1225* (2013.01); *H01L 33/002* (2013.01); *B33Y 80/00* (2014.12)

(56) References Cited

U.S. PATENT DOCUMENTS

| | | | | |
|---|---|---|---|---|
| 5,471,180 | A | 11/1995 | Brommer et al. | 333/202 |
| 5,526,449 | A | 6/1996 | Meade et al. | 385/14 |
| 5,541,613 | A | 7/1996 | Lam et al. | 343/792.5 |
| 5,726,805 | A | 3/1998 | Kaushik et al. | 359/589 |
| 6,134,369 | A | 10/2000 | Kurosawa | 385/132 |
| 6,640,034 | B1 | 10/2003 | Charlton et al. | 385/122 |
| 6,822,305 | B2 | 11/2004 | Hunt | 257/432 |
| 6,888,994 | B2 | 5/2005 | Baumberg et al. | 385/129 |
| 7,981,774 | B2 | 7/2011 | Grier et al. | 438/479 |
| 8,064,127 | B2 * | 11/2011 | Steinhardt | B82Y 20/00 359/325 |
| 8,243,362 | B2 * | 8/2012 | Steinhardt | B82Y 20/00 359/325 |
| 8,508,838 | B2 * | 8/2013 | Steinhardt | B82Y 20/00 359/325 |
| 8,599,472 | B1 * | 12/2013 | Steinhardt | B82Y 20/00 359/325 |
| 2003/0194824 | A1 | 10/2003 | Hunt | 438/29 |
| 2004/0001665 | A1 | 1/2004 | Zoorob | 385/16 |
| 2004/0086249 | A1 | 5/2004 | Zoorob | 385/129 |
| 2004/0091224 | A1 * | 5/2004 | Baumberg | B82Y 20/00 385/129 |
| 2006/0024011 | A1 | 2/2006 | Enokido et al. | 385/129 |
| 2007/0119522 | A1 | 5/2007 | Grier et al. | 148/403 |

OTHER PUBLICATIONS

Levine and Steinhardt, "Quasicrystals: A New Class of Ordered Structures." *Physical Review Letters*, 53:2477-2480 (1984).

Riabinina, et al., "Photoluminescent silicon nanocrystals by reactive ablation." *Applied Physics Letters* 88, Art No. 073105 (2006).

Schechtman, et al., "Metallic Phase with Long-Range Orientational Order and No Translational Symmetry." *Physical Review Letters*, 53:1951-1953 (1984).

ISR PCT/US2006/026430 (2007).

Galdi, et al., "Radiation properties of one-dimensional quasirandom antenna arrays based on rudin-shapiro sequences." arXiv:physics/0502094v2[physics.potics] Feb. 20, 2005.

EPO P 06 82 4766 (2013).

Florescu, et al., "Complete Band Gaps in Two-Dimensional Photonic Quasicrystals." *Physical Review B*, 80(15):155112 (2009).

Zhang, et al., "Absolute Photonic Band Gaps in 12-Fold Symmetric Phontonic Quasicrystals." *Physical Review B*, 63(8):081105 (2001).

Dal Negro, et al., "Light Transport through the Band-Edge States of Fibonacci Quasicrystals." *Physical Review Letters*, 90(5):055501 (2003).

Foresi, et al., "Photonic-Bandgap Microcavities in Optical Waveguides." *Nature*, 390(6656):143-145 (1997).

Johnson and Joannopoulos, "Block-Iterative Frequency-Domain Methods for Maxwell's Equations in a Planewave Basis." *Opt Express*, 8(3):173-190 (2001).

Yablonovitch, "Inhibited Spontaneous Emission in Solid-State Physics and Electronics." *Physical Review Letters*, 58(20):2059-2062 (1987).

Zeng, et al., "Effective-Medium Theory for Weakly Nonlinear Composites." *Physical Review B Condens Matter*, 38(15):10970-10973 (1988).

Chan, et al., "Photonic Band Gaps in Two Dimensional Photonic Quasicrystals." *Physical Review Letters*, 80(5):956-959 (1998).

Cheng, et al., "Defect and Transmission Properties of Two-Dimensional Quasiperiodic Photonic Band-Gap Systems." *Physical Review B*, 59(6):4091-4099 (1999).

Fujiwara and Tsunetsugu, "Electronic Structure and Transport of Quasicrystals." In: *Quasicrystals: The State of the Art*, (DiVincenzo, et al., Eds.) $2^{nd}$ ed., pp. 361-390, World Scientific, Singapore; River Edge, N.J. (1991).

Joannopoulos, et al., *Photonic Crystals : Molding the Flow of Light*, Princeton University Press, Princeton, N.J. (1995).

Kaliteevski, et al., "Diffraction and Transmission of Light in Low-Refractive Index Penrose-Tiled Photonic Quasicrystals." *Journal of Physics: Condensed Matter*, 13:10459-10470 (2001).

Pierce, et al., "Band-Structure Gap and Electron Transport in Metallic Quasicrystals and Crystals." *Physical Review Letters*, 70(25):3919-3922 (1993).

Romero-Vivas, et al., "Resonant Add-Drop Filter Based on a Photonic Quasicrystal." *Optics Express*, vol. 13, No. 3:826-835 (2005).

Sinclair, et al., "Assembly of 3-dimensional structures using programmable holographic optical tweezers", Optics Express, 12(22): pp. 5475-5480, 2004.

Leach, et al., "3D manipulation of particles into crystal structures using holographic optical tweezers." Optics. Express, 12(1): pp. 220-226, 2004.

Korda, et al., "Nanofabrication with holographic optical tweezers." *Review of Scientific Instruments* 73(4): 1956-1957 (2002).

* cited by examiner

FIGURE 2A – 2C
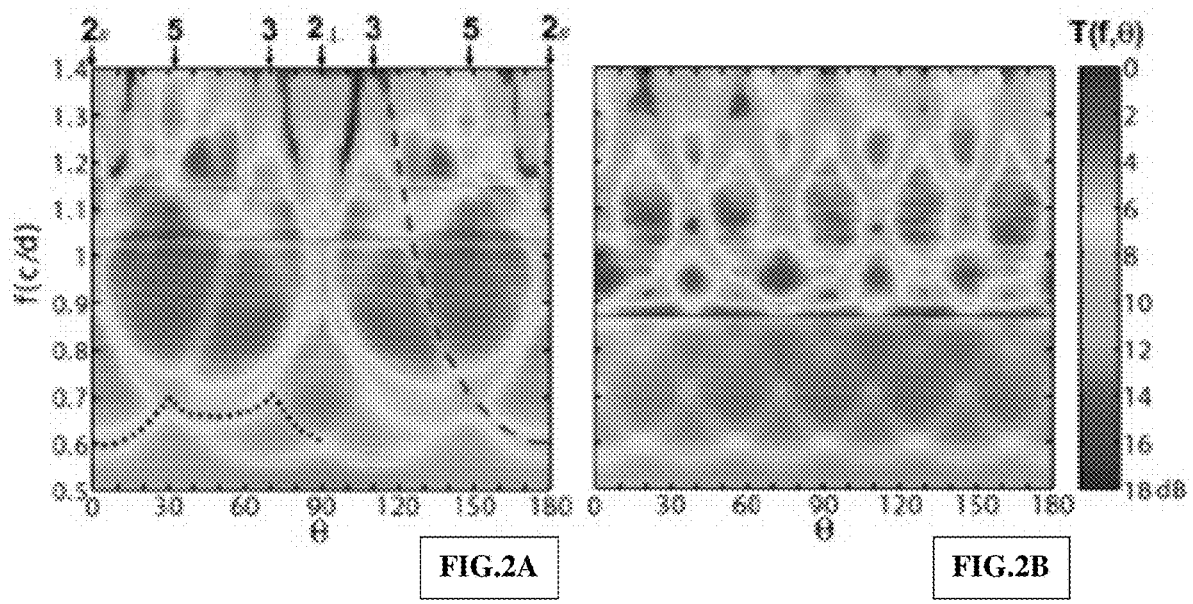
FIG.2A    FIG.2B
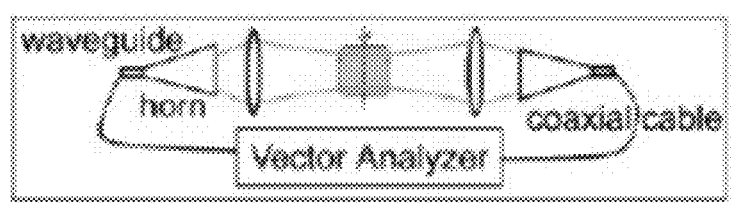
FIG.2C

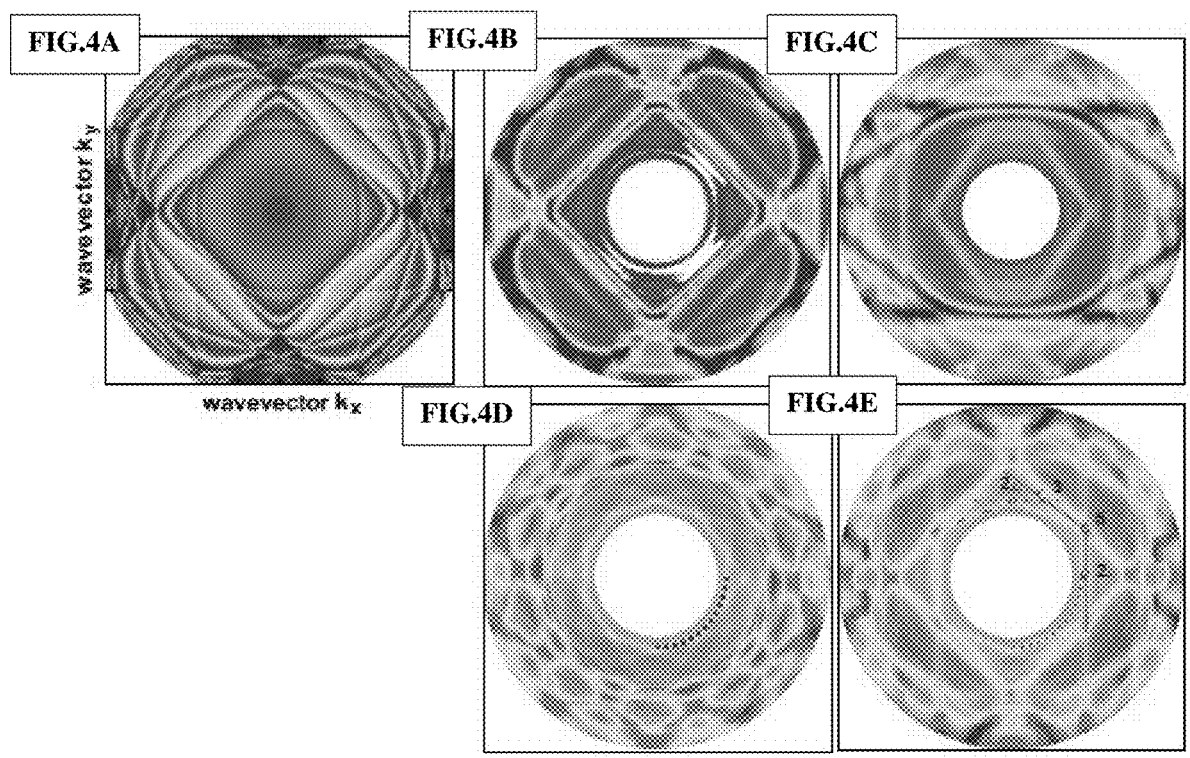

QUASICRYSTALLINE STRUCTURES AND USES THEREOF

CROSS-REFERENCE TO RELATED APPLICATIONS

This application is a Continuation of, and claims priority to, U.S. patent application Ser. No. 16/287,421 filed Feb. 27, 2019, which claims priority to Ser. No. 15/410,396 filed Jan. 19, 2017, now U.S. Pat. No. 10,246,539 issued Apr. 2, 2019, which claims priority to U.S. patent application Ser. No. 14/059,003 filed Oct. 21, 2013, now U.S. Pat. No. 9,567,420 issued on Feb. 14, 2017, which claims priority to U.S. patent application Ser. No. 13/906,792 filed May 31, 2013, now U.S. Pat. No. 8,599,472 issued on Dec. 3, 2013, which claims priority to Ser. No. 13/553,149 filed Jul. 19, 2012, now U.S. Pat. No. 8,508,838 issued on Aug. 13, 2013, which claims priority to U.S. patent application Ser. No. 13/271,969 filed Oct. 12, 2011, now U.S. Pat. No. 8,243,362 issued on Aug. 14, 2012, which claims priority to U.S. patent application Ser. No. 11/988,480 filed Apr. 6, 2009, now U.S. Pat. No. 8,064,127 issued on Nov. 21, 2011, which is a national state entry of PCT/US2006/026430 filed Jul. 7, 2006, which claims priority to Provisional Application Ser. Nos. 60/697,829 filed on Jul. 8, 2005 and 60/697,872 filed on Jul. 8, 2005 the contents of which are incorporated herein in their entirety.

GOVERNMENT RIGHTS

This invention was made with government support under Grant No. DMR0243001 and Grant DMR0213706 awarded by the National Science Foundation, and under Grant No. DE-FG02-91ER40671 awarded by the Department of Energy. The government has certain rights in the invention.

FIELD OF THE INVENTION

This invention relates generally to the field of quasicrystalline structures. In preferred embodiments, the stopgap structure is more spherically symmetric than periodic structures facilitating the formation of stopgaps in nearly all directions because of higher rotational symmetries. More particularly, the invention relates to the use of quasicrystalline structures for optical, mechanical, electrical and magnetic purposes. In some embodiments, the invention relates to manipulating, controlling, modulating and directing waves including electromagnetic, sound, spin, and surface waves, for a pre-selected range of wavelengths propagating in multiple directions.

BACKGROUND OF INVENTION

The speed of electronic devices is achieved by miniaturizing electronic components to a very small micron-size scale so that those electrons need to travel only very short distances within a very short time. Current technology is approaching its fundamental limits in the sub-micron miniaturization process. Further miniaturization introduces several technological problems such as dielectric breakdown, hot carriers, and short channel effects. Optical interconnections and optical integrated circuits provide a way out of these limitations to computational speed and complexity inherent in conventional electronics. Optical components use photons traveling in waveguides instead of electrons to perform the appropriate functions. Optical circuits guide, redirect, trap, and manipulate photons. Thus, there is a need to develop materials to facilitate these actions.

Present technology relies on physical components whose size is large compared to the wavelength of the light being transmitted. For example, currently, light is bent by 90 degrees by guiding it along an optical fiber whose the bend radius is millimeters or greater. By contrast, with photonic crystals, light propagates down straight channels and can be redirected around corners which are a thousand times smaller (a micron in size), thus enabling the entire circuit to be miniaturized. The photonic crystal can also be modified to trap and manipulate the photons. Hence, there is a need to develop photonic crystal components so that photonic circuits can process photons in a way comparable to how electronic circuits process electrons.

SUMMARY OF THE INVENTION

This invention relates generally to the field of quasicrystalline structures. In preferred embodiments, the stopgap structure is more spherically symmetric than periodic structures facilitating the formation of stopgaps in nearly all directions because of higher rotational symmetries. More particularly, the invention relates to the use of quasicrystalline structures for optical, mechanical, electrical and magnetic purposes. In some embodiments, the invention relates to manipulating, controlling, modulating and directing waves including electromagnetic, sound, spin, and surface waves, for a pre-selected range of wavelengths propagating in multiple directions.

In some embodiments, the invention relates to a quasicrystalline structure with quasi-periodic translational symmetry, i.e., an icosahedral quasicrystal, which can be used to filter, stop, redirect, modify and manipulate the propagation of light in user-selected frequency ranges, with closer gap centers and more spherically symmetric stopgap than ordinary periodic crystals. It is the intent of the applicants that the structures can be rescaled to any size or geometry depending on what frequencies are desired.

In some embodiments, the invention relates to observing the changes of electromagnetic transmission through quasicrystalline structures by varying electromagnetic frequencies and direction. In further embodiments, the invention relates to a quasicrystalline material with a complete bandgap.

In some embodiments, the invention relates to a structure whose dielectric constant can be expressed as sum of periodic waves with wavefronts along the symmetry axes of an icosahedron and where the dielectric constant may change continuously or be constructed from a mixture of two or more dielectric materials whose geometrical shapes have different numbers of extended and small dimensions (e.g., a mixture of rods, ellipsoids, and planes). In further embodiments, the symmetry axis has other non-crystallographic symmetries preferably five-fold, seven-fold, or greater than seven-fold, and all symmetries in the plane and either periodic or quasiperiodic in the third direction.

In some embodiments, the invention relates to a structure whose spatially modulated (or varying) dielectric constant (or index of refraction) can be expressed as sum of periodic waves oriented along directions arranged with icosahedral symmetry and where the dielectric constant is smoothly varying or the interface between dielectrics is smoothly varying or is approximated by two or more geometrical (topological) shapes (e.g., rods, ellipsoids, and planes).

In some embodiments the invention relates to a material wherein a dielectric constant may be continuously varying in a quasicrystalline pattern through the medium or the structure maybe composed of discrete elements (rods, ellipsoids and planes) whose placement approximates a smoothly changing density or in which two or more geometrical shapes are used in order to block both polarizations (TE and TM) of photons (i.e., not a single element, like rods only or spheres only).

In some embodiments, the invention relates to a material comprising a plurality of refractive indices at different locations in the material wherein said refractive indices have a plurality of maximum values and a plurality of minimum values and wherein said plurality of maximum and minimum values are located in a pattern that is quasiperiodic. In further embodiments, said pattern is quasiperiodic in three-dimensional space. In further embodiments, said pattern produces an icosahedral shape. In further embodiments, the arrangement is comprised five-fold, seven-fold or greater-fold symmetry axes. In further embodiments, one of the pluralities of refractive indices of a material (one refractive index) does not include any radiation that travels through air or vacuum. In further embodiments, one of the pluralities of refractive indices does not include slight variations at the material's material-gas interface or material-vacuum interface. In further embodiments, the material has slight imperfections at the interface preferably between substances providing differing electromagnetic properties preferably differing refractive indices.

In some embodiments, the invention relates to a structure comprising a first material that is separated into a plurality of units and a second material wherein said first material has a refractive index different from the refractive index of said second material wherein said second material interconnects said plurality of units of said first material wherein said plurality of units of said first material is arranged in a pattern that is quasicrystalline. In further embodiments, said plurality of units are silica spheres. In further embodiments, said pattern produces an icosahedral shape. In further embodiment, said second material is a polyacrylamide hydrogel.

In some embodiment, the invention relates to a structure comprised of a first plurality of geometrical shapes and a second plurality of geometrical shapes wherein said first plurality of geometrical shapes are arranged in a pattern that is quasicrystalline and wherein the second plurality of geometrical shapes are arranged to interconnect the first plurality of geometrical shapes. In further embodiments, said first plurality of geometric shapeS are spheres. In further embodiments, said second plurality of geometric shapes are rods. In further embodiments, said pattern produces an icosahedral shape. In further embodiments, in addition to spheres and rods, one may substitute surfaces, sheets, stars, rhombohedra and other geometrical shapes.

In some embodiments, the invention relates to a method of detecting electromagnetic radiation comprising: a) providing: i) a quasicrystalline structure and ii) electromagnetic radiation; b) directing said electromagnetic radiation through said quasicrystalline structure; and c) detecting said electromagnet radiation.

In some embodiments, the invention relates to a method of creating directionally oscillating electromagnetic radiation comprising: a) providing: i) a quasicrystalline structure ii) a voltage iii) electromagnetic radiation b) applying said voltage across said quasicrystalline structure under conditions such that said quasicrystalline structure oscillates electromagnetically; and c) directing said electromagnetic radiation through said quasicrystalline structure.

In some embodiments, the invention relates to a waveguide comprising a photonic quasicrystal that can guide incoming light at any angle. In further embodiments, the invention relates to a waveguide comprising a photonic quasicrystal formed on the top of a light emitting diode. In further embodiments, the photonic quasicrystal may guide light entering the photonic quasicrystal from any direction.

In some embodiments, the invention relates to a composition comprising a lattice of rods configured such that they interconnect a plurality of lattice points arranged in quasi-periodic pattern.

In some embodiments, the invention relates to a method of detecting photonic band-gaps comprising: i) providing a) a lattice comprising a plurality of optical rods wherein said plurality of rods is configured such that said rods have intersections that form a plurality of lattice points in a quasi crystalline pattern; b) incident electromagnetic radiation; and c) an instrument capable of detecting exiting electromagnetic radiation; ii) directing said incident electromagnetic radiation through said lattice; and iii) detecting said exiting electromagnetic radiation from said lattice with said instrument.

In some embodiments, the invention relates to a composition comprising a lattice of intersecting transparent rods configured such that they form a plurality of lattice points arranged in a quasi-crystalline pattern, In some embodiments, the invention relates to a material comprising a first pattern that is quasicrystalline and defects that are arranged in a second pattern designed to direct and control the radiation.

In some embodiments, the invention relates to a complete bandgap that has the symmetry of the photonic quasicrystal, which can be chosen to be nearly circularly symmetric in two dimensions or nearly spherically symmetric in three dimensions.

In some embodiments, the invention relates to a material comprising a first pattern that is quasicrystalline and defects that are a second pattern.

In some embodiments, the invention relates to a composition of matter which comprises a quasicrystalline arrangement of materials, said materials having a quasiperiodically ordered pattern with a preselectable rotational symmetry having a characteristic photonic bandgap structure forbidden in a crystalline material. In further embodiments, the quasicrystalline structure comprises at least two dielectric materials. In further embodiments, the quasicrystalline structure includes higher point group symmetry than a crystalline counterpart. In further embodiments, a complete bandgap is substantially spherically symmetric and/or substantially circularly symmetric.

In some embodiments, the invention relates to a lamp having a light source comprising a photonic quasicrystal designed to produce radiation substantially only within the visible spectrum or any finite pre-selected frequency range of the electromagnetic spectrum.

In some embodiments, the invention relates to a photonic quasicrystal reflector. In further embodiments, said quasicrystal comprises a two- or three-dimensional quasicrystalline array of dielectric elements.

In some embodiments, the invention relates to a compact optical circuit comprising a photonic quasicrystal reflector.

In some embodiments, the invention relates to an optical filter comprising a dielectric layer formed within a resonant optical cavity, with the dielectric layer having formed therein a sub-wavelength quasicrystalline structure to define, at least in part, a wavelength for transmission of light through the resonant optical cavity, wherein said quasicrystalline structure is a photonic quasicrystal.

In some embodiments, the invention relates to a broadband antenna system comprising multiple photonic bandgap quasicrystals for achieving higher power efficiency over a selected range of frequencies, wherein each of said quasicrystals is designed to cover a specific range of frequencies. In further embodiments, said multiple quasicrystals are attached together to form a photonic bandgap substrate whose bandwidth varies as a function of location on the substrate.

In some embodiments, the invention relates to a photonic bandgap mirror comprising a quasicrystalline lattice structure.

In some embodiments, the invention relates to a stealth material comprising photonic quasicrystals designed to trap electromagnetic radiation at programmable ranges of frequencies. In further embodiments, said radiation is trapped nearly uniformly at all angles.

In some embodiments, the invention relates to a dielectric resonator comprising a resonant defect structure placed in a quasicrystal lattice of dielectric elements In some embodiments, the invention relates to a quasicrystal, quasicrystals or quasicrystal lattice wherein said quasicrystal comprises structural defects introduced by removing or positioning particles or elements in the quasicrystal in a manner to thereby control the optical and physical properties of said quasicrystal.

In some embodiments, the invention relates to a composition of matter comprising a quasicrystal wherein said quasicrystal comprises structural defects introduced by removing or positioning particles or elements in the quasicrystal in a manner to thereby control the optical and physical properties of said quasicrystal.

In some embodiments, the invention relate to a method of making a photonic bandgap material which comprises arranging dielectric elements or materials in a quasicrystalline order, said photonic bond gap material comprising a quasiperiodically ordered pattern with a preselectable rotational symmetry and a characteristic photonic bandgap structure forbidden in a crystalline material. In further embodiments, said quasicrystalline order comprises structural defects introduced by removing or positioning particles or elements in the quasicrystal in a manner to thereby control the optical and physical properties of said quasicrystal.

In some embodiments the invention relates to the use of a quasicrystal to produce a photonic bandgap material.

In some embodiments, the invention relates to an icosahedral photonic quasicrystal.

The present invention relates to photonic quasicrystals, and preferably those that can be used to make photonic bandgap materials. These photonic quasicrystals have many uses, including the same uses as photonic crystals.

It is therefore an object of certain embodiments of the invention to provide an improved system and method for fabricating photonic stopgap structures by using a quasicrystalline arrangement of elements.

It is also an object of certain embodiments of the invention to provide an improved article of manufacture of a three dimensional photonic structures by using a quasicrystalline arrangement of elements.

It is a further object of certain embodiments of the invention to provide an improved system and method for constructing materials having photonic bandgaps forbidden in crystalline materials.

It is yet another object of certain embodiments of the invention to provide an improved system and method for constructing rotationally symmetric structures having optical, structural and mechanical properties unachievable by crystalline materials.

It is an additional object of certain embodiments of the invention to provide an improved quasicrystalline structure having programmable optical, structural, mechanical and chemical properties.

It is also another object of certain embodiments of the invention to provide an improved system and method for constructing a photonic stopgap structure with programmable Brillouin zones for selected technological applications.

It is also a further object of certain embodiments of the invention to provide an improved system and method for constructing a photonic stopgap material with substantially more spherical Brillouin zones.

It is also a further object of certain embodiments of the invention to provide an improved system and method for constructing a photonic stopgap material with substantially more circular Brillouin zones in two dimensions.

It is yet an additional object of certain embodiments of the invention to provide an improved system and method for constructing a quasicrystalline material having long range orientational order without transitional periodicity and constructed to operate in a predetermined manner responsive to electromagnetic radiation.

It is also a further object of certain embodiments of the invention to provide an improved system and method for constructing photonic stopgap structures which can be switched from one structural state to another state by repositioning particles to thereby modify physical and/or chemical properties of the arrangement.

It is also a further object of certain embodiments of the invention to provide an improved system and method for constructing photonic stopgap structures in which structural defects are introduced by removing or positioning particles in the quasicrystal to control the optical and physical properties.

It is still another object of certain embodiments of the invention to provide an improved system and method for constructing photonic stopgap structures by use of optical devices to dynamically modify properties in accordance with time sensitive requirements.

It is yet another object of certain embodiments of the invention to provide an improved system and method for organizing and connecting different linear and nonlinear components in a quasicrystalline structure for large scale integration of optical circuits in two and three dimensions.

It is another object of certain embodiments of the invention to provide an improved system and method for constructing photonic stopgap heterostructures using quasicrystalline arrangements of elements to form engineered features which enable creation of narrow band waveguides and frequency selective filters of electromagnetic radiation.

It is yet another object of certain embodiments of the invention to provide an improved system and method for organizing disparate components to position selectable components in a quasicrystalline structure for establishing chemical and physical properties for a desired technological application

BRIEF DESCRIPTION OF THE DRAWINGS

FIG. 1a shows stereolithographically produced icosahedral quasicrystal with 1 cm length rods. FIG. 1b shows a diamond structure with 1 cm rods. FIG. 1c is a drawing of a triacontahedron, one of several possible effective Brillouin zones of icosahedral symmetry. FIG. 1d shows the Brillouin zone for the FCC/diamond structure.

FIG. 2A-B illustrates the measured transmission for an icosahedral quasicrystal. FIG. 2a plots T(f,θ), transmission as a function of frequency and angle, for a rotation about a two fold rotation axis of the quasicrystal (corresponding to the dotted line in FIG. 1c) using two overlapping frequency bands. The dashed line is a 1/cos(θ) curve characteristic of Bragg scattering from a Brillouin zone face. FIG. 2b plots T(f,θ) for a rotation about a 5-fold rotation axis corresponding to the dashed line in FIG. 1c. FIG. 2c shows a schematic of the microwave horn and lens arrangement used for these measurements.

FIG. 3a depicts the calculated dispersion relation, f, on the boundary of the first Brillouin zone vs. θ, for the diamond structure along the dotted curve in FIG. 1d. FIG. 3b plots T(f,θ) for the sample rotation along the same curve. There is agreement in the photonic gap center frequencies.

FIG. 4A-E provides the imaging of Brillouin zone for diamond and icosahedral quasicrystal structures. FIG. 4a depicts the Brillouin zone for the diamond structure along a 4-fold direction as seen in contour plot of calculated frequency deviation ($\delta f = f - (c/\bar{n})|k|/(2\pi)$) vs. k. FIGS. 4b-e depict the Brillouin zone in plot of the measured T(r=f),θ=θ) (using the same scale as FIG. 3A-B) for the diamond lattice along the (b) 4-fold (dashed in FIG. 1d) and (c) 2-fold (dotted in FIG. 1d) axis; and for the quasicrystal along the (d) five-fold (dashed in FIG. 1c) and two-fold (dotted in FIG. 1c) axes. The inner decagon in (d) and the solid and dashed lines in (e) correspond to dashed and dotted lines in FIG. 1c. The dash-dotted line is a non-triacontahedral zone face.

DETAILED DESCRIPTION OF THE INVENTION

Figure 1A:
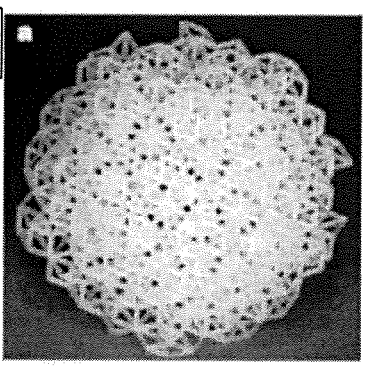
FIG. 1A-D depicts experimental photonic structures and their Brillouin zones.

This invention relates generally to the field of quasicrystalline structures. In preferred embodiments, the stopgap structure is more spherically symmetric than periodic structures facilitating the formation of stopgaps in nearly all directions because of higher rotational symmetries. More particularly, the invention relates to the use of quasicrystalline structures for optical, mechanical, electrical and magnetic purposes. In some embodiments, the invention relates to manipulating, controlling, modulating and directing waves including electromagnetic, sound, spin, and surface waves, for a pre-selected range of wavelengths propagating in multiple directions.

Photonic crystals may have stopgaps that direct which frequencies and directions of light are blocked or allowed to pass through. For example, in a cubic photonic crystal, stopgaps may block light of certain frequencies from exiting its faces while allowing the same frequency of light to escape along its edges. A complete photonic bandgap results when stopgaps overlap in all directions and, for a certain range of frequencies, light is completely trapped. A limitation of photonic crystals is that their periodic translational symmetry constrains the stopgap structure to block only certain directions and frequencies. Quasicrystals have rotational symmetries disallowed for crystals. Quasicrystalline structures can have arbitrary rotational symmetries in two and three dimensions. Because quasicrystals can have higher rotational symmetries, their stopgap structure can be more spherically symmetric than that of any photonic crystal, facilitating the formation of stopgaps in all directions and enabling practical devices to be constructed from a wider variety of materials. Furthermore, because they have quasi-periodic (rather than periodic) translational symmetry, they can have more diverse and controllable stopgap structures.

A "pattern" means a two- or three-dimensional structure that can be constructed by either: (a) repeating a finite number of bounded design motives, structural elements, or building blocks joined along their boundaries or overlapping one another; or (b) overlaying regular sinusoidal waves of density or other physical property (such as dielectric constant) in which the waves are oriented in different directions.

A "location" means a point or extent in space. A pattern is "periodically ordered" or "crystalline" or "crystal ordered" if it can be constructed either: (a) from a single design motif, structural element or building block repeated with equal spacing between repetitions joined together along their boundaries without overlapping one another and the combined pattern only has two-, three-, four- or six-fold symmetry axes; or (b) overlaying regular sinusoidal waves of density or other physical property (such as dielectric constant) in which the waves are oriented along only directions where the combined wave pattern has only two-, three-, four- or six-fold symmetry axes. The terms "crystal pattern" or "crystalline pattern" are synonyms for periodic pattern.

Periodic means repeating at regular (equal) intervals. A "period" is the interval between repetitions. As used herein, the term "quasiperiodic pattern" often refers to the quantity of some physical characteristic of matter, like the density or dielectric constant or spin or other feature. A pattern is "quasiperiodic" if it can be decomposed into repeating elements or waves with more than one frequency in which the ratios of frequencies is irrational, or if it can be decomposed in a sum of regularly sinusoidal waves whose crests overlap at more than one frequency in which the ratios of frequencies is irrational. Rational means the numbers are expressible as a ratio of integers, such as 5/3. Irrational means numbers are not exactly expressible as a ratio of integers, such as, but not limited to, a ratio containing the square root of two. Irrational numbers have decimal expansions that neither terminate nor become periodic. It is the intent of the applicants that the term "irrational" with relation to quasiperiodic include approximants of irrationals as well. For example, a rational approximant is a ratio of integers P/Q whose value is nearly equal to the value of the irrational. For example, the golden ratio is $(1+\sqrt{5})/2 = 1.618033\ldots$ [and so on as there is no finite decimal]. A rational approximant is $21/13 = 1.61538$, since no ratio with denominator less than 13 comes closer to the actual value. One can construct a series of rational approximants that come as close as you want to an irrational number (but not quite equal it). For example, $34/21 = 1.61905$, $55/34 = 1.61765$, and $233/144 = 1.61806$.

Quasiperiodic includes a quantity that is not periodic itself but that can be expressed as a finite sum of periodic quantities whose periods have ratios that are irrational. An example is $x[n] = n(1+(1/t^2)) + (1/t) \{\{n/t\}\}$, where $t = (1+\sqrt{5})/2 = $ golden ratio (an irrational number) and where $\{\{\bullet\bullet\}\}$ means truncate the integer part of the quantity inside and keep only the decimal part. The function $x[n]$ describes a quasiperiodic spacing of points in one dimension in which the first term is periodic with period $(1+(1/t^2))$ and the second term is periodic with period t. The ratio of the two periods is an irrational number. This example corresponds to a "Fibonacci" lattice of distances, which can be seen in some directions in a two dimensional Penrose tiling and also the three-dimensional icosahedral quasicrystal. In another example, quasiperiodic in D dimensions means a quantity that is quasiperiodic along any line in D dimensions.

A pattern is "quasicrystalline" or "quasicrystal ordered" if it is quasiperiodic and has at least one five-, seven-, or higher-fold symmetry axis. A quasicrystal pattern may be constructed either: (a) from a finite number of distinct design motives, structural elements, or building blocks each of which regularly repeats with an independent average spacing and where the ratios of the spacings is irrational and the pattern includes five-, seven- or any higher-fold symmetry axes; or (b) overlapping regular sinusoidal waves of density or other physical property (such as dielectric constant) in which the waves are oriented along directions where the combined pattern includes five-, seven- or any higher-fold symmetry axes.

An infinite periodic pattern has the property that two overlapping copies of the pattern can be shifted with respect to one another by a finite distance and overlap once again. An infinite periodic pattern also has the property that two overlapping patterns can be rotated by a finite angle along a discrete set of axes and overlap once again. The discrete set of angles which result in this overlap defines the rotational symmetry of the periodic pattern, which, according to the well-known rigorous mathematical theorems of crystallography, only allows two-, three-, four- and six-fold rotational symmetry in the plane and two-, three-, four- and six-fold symmetry axes in three dimensions. A finite piece of an infinite periodic pattern is also called a periodic pattern, provided it contains a multiplicity of the repeating motives, structural elements, or building blocks.

An infinite quasiperiodic pattern made of discrete elements has the property that two overlapping copies of the pattern cannot be shifted with respect to one another by a finite distance and precisely overlap throughout. An infinite quasiperiodic pattern made of discrete elements also has the property that a sequence of finite shifts can be found so that the two copies overlap out to longer and longer distances. An infinite quasicrystalline pattern also has the property that it can be rotated by finite set of angles along a discrete set of axes so that the orientations of the design motives, structural elements, building blocks or sinusoidal waves composing the rotated pattern are the same as the original pattern. The finite set of angles which define the rotational symmetry of the quasicrystalline pattern, which must include at least one five-, seven-, or higher-fold symmetry axes. A finite piece of an infinite quasicrystalline pattern is also called a quasicrystalline pattern, provided it contains a multiplicity of the repeating motives, structural elements, or building blocks.

An example of periodic order in two-dimensional space is squares that make up a grid. Two overlapping square grids can be shifted with respect to one another by the length of one edge, or a multiple thereof, and the two grids will overlap again. Also, squares have 4-fold symmetry. Another example of a periodic pattern would be a grid of hexagons that has 6-fold symmetry. However, one cannot create a two-dimensional grid of solely true pentagons without producing a spatial gap or overlap. Also, one cannot construct a pattern with periodic order with five-, seven- or any higher-fold symmetry axes.

An example of a quasicrystalline pattern is the two-dimensional Penrose pattern composed of acute and obtuse rhombi (diamond shapes)—an acute one with a small angle of 36 degrees and the obtuse one with a small angle of 72 degrees—in which the acute and obtuse rhombi repeat with different average frequencies whose ratio is the golden ratio, $(1+\sqrt{5})/2$, an irrational number, and in which the pattern has an average ten-fold symmetry. As for all quasicrystalline patterns, there cannot be more than a single point of "exact" infinitely expanding symmetry. This Penrose pattern is quasiperiodic.

For example, the Penrose pattern is decagonal even though it contains not even a single point of "exact" 10-fold symmetry. If a red Penrose pattern is placed over an identical blue one and the red pattern is then rotated counterclockwise, nothing interesting happens until a 10-fold (36 degree) rotation is completed and a fair fraction of the vertices of the two patterns coincide. The red tiling is then translated by some amount until whole regions, of about 10 to 15 patterns across, coincide. Finally, the red pattern is translated even further until regions of the order of the full patch coincide. Between the coinciding regions there always remain strips, often called "worms," containing patterns that do not match. If we could see the entire infinite pattern we would observe that any bounded region in the rotated pattern can be found in the unrotated pattern, but the larger the region the further away we have to look in order to find it. Even so, there is no translation that will bring the whole infinite red pattern into full coincidence with the infinite blue one.

It is possible to make two patterns that are not identical that contain the same statistical distribution of bounded substructures of arbitrary size. Bound specific patches of two Penrose patterns that differ by a 10-fold rotation both contain roughly the same number of 5-fold stars and roughly the same number of such stars that are surrounded by five thin rhombic shapes. The two patterns contain the same statistical distribution of bounded structures at all scales. Two patterns that are statistically the same in this sense are called "indistinguishable." For patterns with quaisperiodic order, a symmetry operation is one that takes the pattern into an indistinguishable one. Quasiperiodic order may be created in three-dimensional space and the definition is not intended to be limiting to two-dimensional order.

A "photonic quasicrystal" means a quasicrystal that is capable of allowing the transmission, steering, manipulation, and control of some electromagnetic radiation. It is not intended that the term be limited to the transmission of electromagnetic radiation in the visible region. It is also not intended to be capable of transmitting of all electromagnetic radiation. In some preferred embodiments, the photonic quasicrystal refracts, reflects, defracts, or absorbs electromagnetic radiation at individual frequencies.

A "heterostructure" means a dielectric structure with one or more interface(s) across which the chemical composition changes. The interface of the two dielectrics contains a scattering centre in which light propagates more slowly. If the scattering centers are regularly arranged in a medium, light is coherently scattered. In this case, interference causes some frequencies not to be allowed to propagate, giving rise to forbidden and allowed bands. Regions of frequency may appear that are forbidden regardless of the propagation direction.

A "photonic bandgap" material or structure means that for a certain range of wavelengths, no states exist in the structure for electromagnetic radiation to occupy. Electromagnetic radiation with these wavelengths is forbidden in the structure and cannot propagate. The presence of a single point defect, i.e., part of the structure in which the electromagnetic radiation can propagate, generally results in a "localized state", i.e., a tightly confined region of light energy which must stay within the defect, since it cannot propagate in the structure, and provided the energy is not being absorbed by the material. By introducing defects, one can introduce allowed energy levels in the gap. Defects, appropriately designed and arranged, can create waveguides with directional control (e.g., one micron radius, 90 degree bends with 98 percent transmission efficiency), drop/add filters, multiplexors/demultiplexors, resonators, and laser cavities.

A "quasicrystalline lattice structure" means that the quasicrystal is in the form of material patterned with an open framework. For example, in preferred embodiments, the quasicrystal is made by stereolithography in which polymerization produces rhombohedral cells characterized by rods that creates an open framework.

A "dielectric resonator" or "cavity" means a device arranged that allows electromagnetic radiation to propagate back and forth and build up intensity. An "optical resonator" or "resonant optical cavity" means an arrangement of optical components which allow a light beam to propagate back and forth and build up intensity. For example, if a mirror is partly transparent one can feed light from outside into the cavity. Two highly reflecting low-less reflectors may be positioned with their reflecting surfaces facing one another to form the cavity. A collimated laser beam enters the cavity and the wavelength of the incident light is rapidly swept in time. At specific wavelengths and at specific feature positions, light resonates within the cavity, building up energy, corresponding to a peak in the transmitted light.

"Visible spectrum" means electromagnetic radiation that ranges from approximately 780 nanometers (abbreviated nm) to approximately 380 nm. A regular incandescent bulb produces light within the visible spectrum. It also wastes a lot of its energy radiating invisible radiation, too. The photonic quasicrystal can be tailored so that it radiates almost all of its light in the desired visible with little (not really zero) waste. This is the reason for saying "substantially only" with regard to emitting light in the visible region.

An "interconnect" means a physical attachment between two or more objects.

A "preselectable rotational symmetry having a characteristic photonic bandgap structure forbidden in a crystalline material" means the structure has at least one five-, seven- or higher-fold symmetry axis and whose bandgap structure exhibits this same symmetry. For example, a photonic quasicrystal can have three-dimensional icosahedral symmetry or two dimensional seven-fold symmetry, either of which are impossible for photonic crystals.

As used herein, a material having a spherically symmetric property means that rotation by any angle in three dimensions produces no change with regard to the physical property. Circularly symmetric means that rotation by any angle two dimensions produces no change. Bandgaps are not precisely spherically symmetric (same for circularly symmetric); thus, usage is intended to be substantially so.

A "quasicrystalline structure includes higher point group symmetry than a crystalline counterpart" means that the quasicrystal can have seven-, eight-, and higher-fold symmetry axes, whereas periodic crystals can never have greater than six-fold symmetry. For example, a crystal, planar hexagonal lattice has six-fold symmetry, the highest and most circular symmetry possible for a crystal or periodic pattern. Quasicrystals allow higher, more circular symmetries, such as patterns with seven-, eleven-, forty-seven- or even higher symmetries, Similarly in three-dimensions, the highest symmetry possible for a periodic pattern or crystal is cubic symmetry, whereas quasicrystals can have icosahedral symmetry, which includes five-fold symmetries and which is more spherically symmetric.

"Achieving higher power efficiency over a selected range of frequencies" means that more of the input power is converted into radiation of the desired frequencies and less is wasted in producing undesired frequencies. For example, an ordinary microwave antenna also broadcasts near infrared and radio waves which are not useful for microwave transmission, but a quasicrystalline antenna would stop the unneeded waves and refocus their power towards producing more microwave radiation at the useful frequencies.

A "sub-wavelength quasicrystalline structure" means the spacing between the repeating elements in the quasicrystalline structure is smaller than the wavelength of the light.

A "stealth material" means a radar absorbent material that absorbs the incoming radar radiation without producing any reflections.

When light strikes a substance, some absorption and some reflection take place. Substances that transmit almost all the light waves that fall upon them are said to be transparent. A transparent substance is one through which you can see clearly. Clear glass is transparent because it transmits light rays without scattering them. Transparent media such as glasses are isotropic, i.e., light behaves the same way no matter which direction it is traveling in the medium. Substances through which some light rays can pass but through which objects cannot be seen clearly because the rays are scattered are called translucent. Substances that do not transmit any light rays are called opaque.

The angle at which the beam is reflected depends on the angle at which it strikes the mirror. The beam approaching the mirror is the incident or striking beam, and the beam leaving the mirror is the reflected beam. Any type of mechanism used to reflect light is called a reflector. The term "reflected light" simply refers to light waves that are neither transmitted nor absorbed, but are thrown back from the surface of the medium they encounter. When light is reflected from a mirror, the angle of reflection of each ray equals the angle of incidence. When light is reflected from a substrate of an uneven surface, the reflected beam is scattered, or diffused. Because the surface of the substrate is not smooth, the reflected light is broken up into many light beams that are reflected in different directions.

An antenna is a conductor or a set of conductors used either to radiate electromagnetic radiation into space or to collect electromagnetic radiation from space. A transmitter is a device that generates electromagnetic radiation. A signal travels through a transmission line to an antenna. The antenna converts the signal into waves that radiate into space from the antenna. The waves travel through space. If another antenna is placed in the path of the waves, it absorbs part of the waves and converts them to a signal that travels through another transmission line and is fed to a receiver.

The term waveguide means any type of transmission line in the sense that it is used to guide electromagnetic radiation from one point to another. Typically, the transmission of electromagnetic energy along a waveguide travels at a velocity somewhat slower than electromagnetic radiation traveling through free space. A waveguide may be classified according to its cross section (rectangular, elliptical, or circular), or according to the material used in its construction (metallic or dielectric). Glass fibers, gas-filled pipes, and tubes with focusing lenses are examples of optical waveguides.

As used herein, the dielectric constant means the extent to which a substance concentrates the electrostatic lines of flux. Substances with a low dielectric constant include a perfect vacuum, dry air, and most pure, dry gases such as helium and nitrogen. Materials with moderate dielectric constants include ceramics, distilled water, paper, mica, polyethylene, and glass. Metal oxides, in general, have high dielectric constants.

The refractive index is related to the dielectric constant of a material. The refractive index (or index of refraction) of a material is the factor by which the phase velocity of electromagnetic radiation is slowed in that material, relative to its velocity in a vacuum. Although it is not intended that the invention be limited by any particular mechanism, it is believed that an electromagnetic wave's phase velocity is slowed in a material because the electric field creates a disturbance in the charges of each atom (primarily the electrons) proportional to the permittivity. The charges, in general, oscillate slightly out of phase with respect to the driving electric field. The charges thus radiate their own electromagnetic wave that is at the same frequency but with a phase delay. The macroscopic sum of all such contributions in the material is a wave with the same frequency but shorter wavelength than the original, leading to a slowing of the wave's phase velocity. Most of the radiation from oscillating material charges will modify the incoming wave, changing its velocity.

If the refractive index of a medium is not constant, but varies gradually with position, the material is known as a gradient-index medium. The refractive index of certain media may be different depending on the polarization and direction of propagation of the electromagnetic radiation through the medium. A strong electric field of high intensity electromagnetic radiation (such as the output of a laser) may cause a medium's refractive index to vary as the electromagnetic radiation passes through it, giving rise to nonlinear optics. Thus, in preferred embodiments, the invention relates to a material that contains regions with changing refractive indices that are arranged in quasicrystalline order.

A material having a "plurality of refractive indices" means that the material does not have a single uniform refractive index when transmitting electromagnetic radiation along a single axis. As used herein, a "plurality" means two or more. This may be the result of the material being constructed from two or more materials or because the molecular components of the material are arranged in varying orientations or constitution along the axis. In certain preferred embodiments, the refractive index of the material is continuously varying in waves from a maximum value, i.e., because the electromagnetic radiation is slowed, to a minimum value, i.e., the electromagnetic radiation is traveling at its fastest velocity, through the material in a pattern that is quasiperiodic. A plurality of medium values means that the refractive indices are a value in between the maximum and minimum values, preferably an average or median value. It is not intended that the maximum, minimum, and medium values be entirely consistent, but it is sufficient that they are similar in relative values to the extent that the production methods employed result in slight deviations.

Optical interconnections and optical integrated circuits have several advantageous over their electronic counterparts. They are free from electrical short circuits. They have low-loss transmission and provide large bandwidth; i.e., multiplexing capability, capable of communicating several channels in parallel without interference. They are capable of propagating signals within the same or adjacent fibers with essentially no interference or cross-talk. They are compact, lightweight, and inexpensive to manufacture, and more facile with stored information than magnetic materials. Hybrid electro-optical components are limited solely by the speed of their electronic parts.

Photodiodes are devices that utilize the photoelectric effect, i.e., emission of electrons from matter upon the absorption of electromagnetic radiation, including p-n junction or p-i-n structures. When light with sufficient photon energy strikes a semiconductor, photons can be absorbed, resulting in generation of a mobile electron and electron hole. If the absorption occurs in the junction's depletion region, these carriers are swept from the junction by the built-in field of the depletion region, producing a photocurrent. Photodiodes can be used in either zero bias or reverse bias. In zero bias, light falling on the diode causes a voltage to develop across the device, leading to a current in the forward bias direction. This is called the photovoltaic effect, and is the basis for solar cells.

Diodes usually have relatively high resistance when reverse biased. This resistance is reduced when light of an appropriate frequency shines on the junction. Hence, a reverse biased diode can be used as a detector by monitoring the current running through it. Circuits based on this effect are more sensitive to light than ones based on the photovoltaic effect. P-N photodiodes are used in similar applications to other photodetectors, such as photoconductors, charge-coupled devices, and photomultiplier tubes.

Photonic quasicrystals act as optical devices that make it possible to control which bands of photons pass through the structure and which ones are blocked. An icosahedral photonic quasicrystal may be a quasicrystalline array of two or more materials with different dielectric constants (or, different indices of refraction) that has nearly spherically symmetrical photonic bandgaps. Icosahedral photonic quasicrystals are preferred for three-dimensional (3D) applications. Quasicrystals with high order rotational symmetry are preferred for many two dimensional (2D) applications.

Photonic crystals have a variety of technological uses due to their stopgaps (also called bandgaps) that block light of certain frequencies from passing along certain directions. Although such crystalline structures allow many technological applications to be fulfilled, their periodic translational symmetry constrains the stopgap structure to have only certain rotational symmetries and frequencies. Quasicrystalline heterostructures can have arbitrary rotational symmetries in two and three dimensions. Many of the most important applications of photonic materials require blocking the passage of light in all directions, effectively trapping the light inside the material. Because quasicrystals may have higher rotational symmetries, their stopgap structure can be more spherically symmetric than that of any photonic crystal, facilitating the formation of stopgaps in all directions and enabling practical devices to be constructed from a wider variety of materials. Furthermore, because they have quasiperiodic (rather than periodic) translational symmetry, they can have more diverse and controllable stopgap structures.

The quasicrystals may be constructed from two or more types of dielectric material arranged in a quasiperiodic pattern whose rotational symmetry is forbidden for periodic crystals (such as five-fold symmetry in the plane and icosahedral symmetry in three-dimensions). Because quasicrystals often have higher point group symmetry than ordinary crystals, their gap center frequencies are closer and the gaps widths are more uniform, optimal conditions for forming a complete bandgap that is more nearly spherically symmetric. Although previous studies have focused on 1D and 2D quasicrystals, where exact (1D) or approximate (2D) bandstructures can be calculated numerically, analogous calculations for the 3D case are computationally challenging and have not been performed to date. To circumvent the computational problem, stereolithography has been used to construct a photonic quasicrystal with centimeter-scale cells and to perform microwave transmission measurements. The 3D icosahedral quasicrystals exhibit sizeable stopgaps and, despite their quasiperiodicity, rather uncomplicated spectra which allow experimental determination of the faces of their effective Brillouin zones. These results suggest that 3D icosahedral quasicrystals can act as photonic bandgap materials. In preferred embodiments, the characteristic length of a photonic band-gap quasicrystal matches the range of wavelengths of electro-magnetic radiation it interacts with, e.g. cm for microwaves, 1-10 μm for near infrared, and 0.4-0.8 μm for visible light.

In 1984, Schechtman et a.l Metallic phase with long-range orientational order and no translational symmetry, *Phys. Rev. Lett.*, 53, 1951-1953 (1984) observed icosahedral symmetry with five-fold rotation axes in the electron diffraction pattern of an alloy of Al—Mn. Simultaneously, the concept of long range quasiperiodic order with icosahedral symmetry was theoretically developed by Levine and Steinhardt, Quasicrystals: A New Class of Ordered Structures, *Phys. Rev. Lett.* 53, 2477-2480 (1984).

Figure 1B:
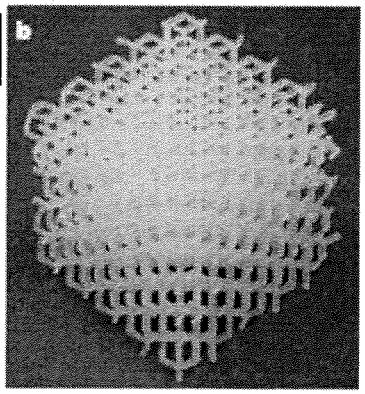

A photonic icosahedral quasicrystal is shown in FIG. 1a. The diamond structure shown in FIG. 1b was made for comparative experiments; diamond has been suggested as an optimal structure for photonic crystals. Photonic crystals are based on the fact that photons Bragg scatter from a medium with a periodically modulated refractive index. Multiple scattering at frequencies near the Bragg condition prevents propagation in these directions, producing a "stopgap." Overlap of the stop gaps in all directions yields a complete photonic bandgap and traps the light. A complete overlap occurs more readily in more isotropic structures.

Quasicrystals have long-range quasiperiodic order and higher point group symmetries, so photons Bragg scatter along a more spherically symmetric set of directions. As the symmetry increases, the "Brillouin zone" becomes more circular or more spherical. Photonic quasicrystals also allow for a higher degree of flexibility and tunability for defect mode properties.

Figure 1C:
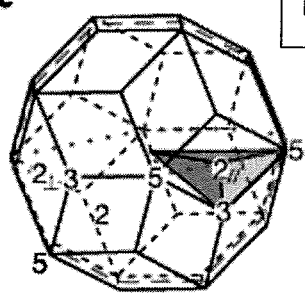
Figure 1D:
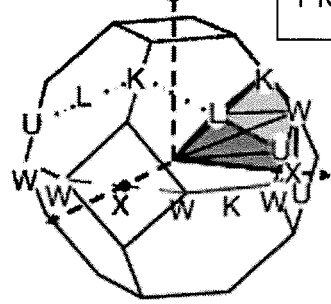

FIG. 1c shows the effective Brillouin zone (related to the Pseudo-Jones zone considered in electronic transport in quasicrystals) of the icosahedral structure with its irreducible Brillouin zone highlighted in yellow. For comparison, FIG. 1d shows the first Brillouin zone of the diamond (FCC) structure with its irreducible Brillouin zone. As a measure of sphericity, along the edge of diamond structure's irreducible Brillouin zone, the magnitude of k (which is proportional to stop gap center frequency in first order approximation) increases 29.1% from L to W. Along the edge of the effective irreducible triacontahedral Brillouin zone of the icosahedral structure, the magnitude of k increases only 17.5% from the two fold to the five fold symmetry points. Moreover the triacontahedron's faces are identical and subtend smaller solid angles.

Figure 3A:
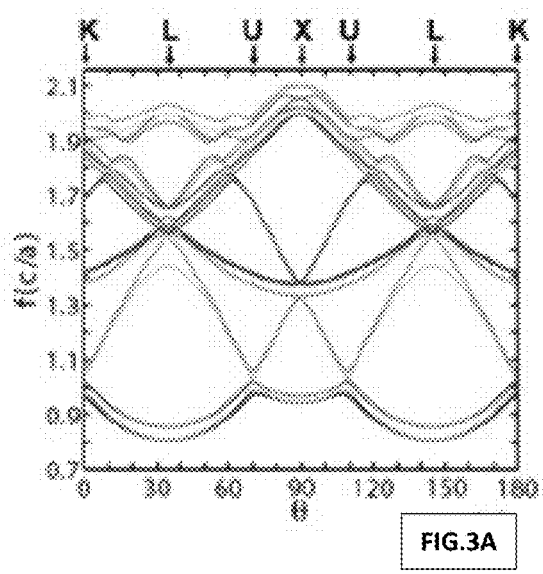
FIG. 3A-B illustrates a comparison of calculated bands and measured transmission for a diamond structure.

The photonic bands of our rod decorated diamond lattice were obtained using the MIT Photonic-Bands package. FIG. 3a shows the calculated band structure along a rotation about a 2-fold axis. The rotation path is illustrated by the dotted red line in FIG. 1d. There is excellent agreement between the observed and calculated gap positions.

Figure 3B:
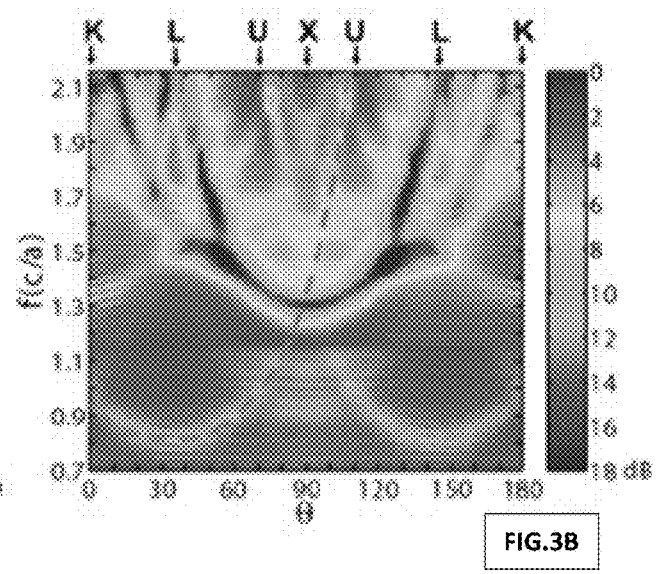

From the rather complex spectra, the gaps appear to result from Bragg scattering. A wavevector, which resides on the plane defined by a reciprocal lattice vector G is Bragg scattered by G. Such a wavevector satisfies the condition $k \cdot G = |G|^2/2$ or equivalently, $|k| = |G|/(2 \cos(\theta))$. To lowest order, the center frequency of a stopgap is therefore $f_G = (c/\bar{n})|G|/(4\pi \cos(\theta))$, where c is the speed of light and $\bar{n}$ is the Bruggeman effective medium index [14]. The dashed curves in FIGS. 2a and 3b correspond to a) $1/\cos(\theta-\theta_o)$ angular dependence, hence Bragg scattering.

Compared with the diamond structure, the quasicrystal spectrum appears less complex. Since the scattering function for a quasicrystal is a dense set of Bragg spots (of zero measure), many gaps and zone faces intersecting might be expected. On the contrary, there appear to be a few well defined $1/\cos(\theta-\theta_o)$ curves in FIG. 2A-B and therefore few zone boundaries with sizable gap formation. As a novel method for visualizing the effective Brillouin zone structure, the process was inverted by using the gaps to find the zone faces. The points in reciprocal space responsible for the gaps are located by assuming $|k)\theta)|\sim\bar{n}f(\theta)/(2\pi c)$ and polar plots of $T(r=f, \theta=\theta)$ are made (FIG. 4A-E). For the diamond lattice, data from a rotation about a 4-fold axis (dashed line in FIG. 1d) and a 2-fold axis (dotted line in FIG. 1d) are shown in FIG. 4b and FIG. 4c, respectively. FIG. 4a. shows the calculated frequency deviation $(|\delta f|=|(f-(c/\bar{n})|k|/2\pi))$ vs. wavevector of the 4-fold rotation.

Transmission data for the quasicrystal is shown in FIGS. 4d and 4e. The fact that the low transmission regions correspond to straight lines indicates that the gaps lie on planes. These transmission polar plots, without any further analysis, directly provide the scattering planes and the effective Brillouin zones. In the smallest zone in FIGS. 4d and 4e, the decagon is seen from the 5-fold rotation, and the additional symmetry planes are seen from the orthogonal 2-fold rotation, which correspond to the respective cuts of the triacontahedral Brillouin zone shown in FIG. 1c. (The wavevector corresponding to the edge center of the smallest visible decagon in FIG. 4d is $\tau^2/\sqrt{\tau^2+1}$ in units of $2\pi/d$, where d is the rod length.) There are however, several unexpected features: a strong scattering plane along a 45° direction, the absence of strong scattering from the "2⊥" plane (dashed line; which may be a polarization effect due to the rod decoration of the unit cells), and another strong scattering plane (dash-dotted line) not on the triacontahedron. A complete photonic bandgap would result if the dotted blue curves, (cuts of a constant frequency sphere) were contained within the gap of the zone boundary.

These results establish the following. First, there is a relatively well-defined effective Brillouin zone, all of whose faces are consistent with the quasicrystal Bragg pattern. Second, the Brillouin zone structure is surprisingly simple despite the fact that a quasicrystal has a dense set of Bragg spots. Third, the measured Brillouin zone is close to spherical, with the largest difference in gap center corresponding to 17% (dotted curve in FIG. 2a). Also, the experiments demonstrate that three-dimensional quasicrystals exhibit sizable stopgaps on reasonably well-defined effective Brillouin zone faces. For preferred embodiments a smoother, more spherical multiply connected unit cell decoration with more equal filled/void ratio would reduce polarization effects and enhance the gap overlap while maintaining the nearly spherical Brillouin zone. Laser tweezers used for particle trapping or two-photon polymerization would allow construction of a quasicrystalline matrix of dielectric components with a photonic bandgap in the visible.

Photonic quasicrystals can be used for many purposes and to produce a variety of compositions and products including but not limited to lamps, compact optical circuits, optical filters, efficient antenna substrates, mirrors, stealth materials, dielectric resonators, semi-conductors, patterned materials. Such compositions and products can be 2D or 3D objects and have photonic bandgap materials composed of quasicrystals. Any material that can be used in the production of photonic crystals can be used to make photonic quasicrystals. Products, compositions and materials produced from photonic quasicrystals are an improvement over those made from photonic crystals, at least in part because of the bandgap properties of the quasicrystalline structures.

Methods to produce photonic crystals can be adapted to produce photonic quasicrystals by determining the desired quasiperiodic structure that is desired for a particular application. For example, liquid polymers can be photopolymerized at discrete points using computer-directed lasers to cause two-photon polymerization and thus produce discrete structures bathed in a liquid of unpolymerized monomers (that are then removed or washed) away. In accordance with this invention, 3D structures using icosahedral quasicrystals exhibit near spherical symmetry and are particularly useful.

By way of example, incandescent lamps are highly inefficient and produce electromagnetic radiation over a broad frequency range, most of which is unseen by the human eye. A lamp constructed from a photonic quasicrystal can be designed to only produce radiation within the visible spectrum, resulting in a highly efficient conversion of input power into useful visible luminosity. Preferably such lamps are made from a 3D photonic quasicrystals, and more preferably from icosahedral photonic quasicrystals.

A photonic quasicrystal can be used as a reflector to enable a light beam in a photonic circuit to be reflected at angles greater than the critical angle and thus create compact optical circuits. Such photonic bandgap devices can be a two- or three-dimensional quasicrystalline array of dielectric elements, or, for the two-dimensional case, an array of columnar holes formed in a substrate. The holes are filled with air or another material having a different dielectric constant than the substrate. The quasicrystal structure allows angles of reflection and combinations of frequency bandgaps that are not possible for crystals. For example, the compact optical waveguide of U.S. Pat. No. 6,134,369 can be adapted to use photonic quasicrystals.

An optical filter includes a dielectric layer formed within a resonant optical cavity, with the dielectric layer having formed therein a sub-wavelength periodic structure to define, at least in part, a wavelength for transmission of light through the resonant optical cavity. The optical filter has applications to spectrometry, colorimetry, and chemical sensing. For example, optical filters of the invention can be made from photonic quasicrystals using methods described for photonic crystal analogues as set for the in U.S. Pat. No. 5,726,805.

A broadband antenna system utilizes multiple photonic bandgap crystals to achieve higher power efficiency over a selected range of frequencies. Multiple custom tailored photonic bandgap quasicrystals can be used to form a substrate for the antenna system. Each of the quasicrystals is designed to cover a specific range of frequencies. The multiple quasicrystals are attached together to form a photonic bandgap substrate whose bandwidth varies as a function of location on the substrate. Photonic quasicrystals enable a range of frequency bands and angles of reflection that are impossible for crystals. For example, antenna systems of the invention can be made from photonic quasicrystals using methods described for photon crystal analogues as set for the in U.S. Pat. No. 5,541,613.

An optical circuit and waveguide can be fabricated on a substrate having a two-dimensional quasiperiodic dielectric structure with arbitrary symmetry. The quasiperiodic dielectric structure exhibits a range of frequencies of electromagnetic radiation which cannot propagate into the structure and are not possible for photonic crystals. Radiation at a frequency within the frequency bandgap of the structure is confined within the circuit and waveguide by the quasicrystalline dielectric structure surrounding the circuit and waveguide. Radiation losses are substantially eliminated. For example, optical circuit and waveguides of the invention can be made from photonic quasicrystals using methods described for photon crystal analogues as set for the in U.S. Pat. No. 5,526,449.

A photonic bandgap mirror having a quasicrystalline lattice structure is placed in front of light emitted from one side of the laser diode array. If the photonic quasicrystal has an incomplete bandgap, light parallel to the symmetry axis will be primarily reflected while light at select angles—depending on the symmetry of the quasicrystal—is transmitted through the mirror. Such a mirror is useful for making a laser cavity. The photonic quasicrystal allows reflection and transmission angles that are impossible for photonic crystals. For example, quasicrystal mirrors of the invention can be made from photonic quasicrystals using methods described for photon crystal analogues as set for the in U.S. Pat. No. 5,365,541.

Photonic quasicrystals can be designed as material that traps electromagnetic radiation at programmable ranges of frequencies nearly uniformly at all angles and thus has use for stealth applications.

A dielectric resonator comprised of a resonant defect structure placed in a quasicrystal lattice of dielectric elements confines electromagnetic energy within a frequency band in the photonic bandgap. The frequency band of the confined electromagnetic energy is thus controllable based on the selected quasicrystal lattice. For example, dielectric resonators of the invention can be made from photonic quasicrystals using methods described for photon crystal analogues as set for the in U.S. Pat. No. 5,187,461.

EXAMPLES

Example 1. Stereolithography Created Lattices

A D-dimensional periodic lattice has D integer independent basis vectors, while D+N integer linearly independent vectors (with integer N≥1) are required to describe the quasicrystal lattice. The icosahedral quasicrystal lattice of points can be constructed by projecting the points of a six-dimensional hypercubic lattice, the six-dimensional analog of a three-dimensional cubic lattice. The coordinate of any lattice point can be described by the relation: $R=\Sigma_{i=1}^{6} n_i a_i$, where the $n_i$ are a subset of the integers and $a_i$ are the 6 basis vectors: $a_1=(1,\tau,0)$, $a_2=(-1,\tau,0)$, $a_3=(0,1, \tau)$, $a_4=(0,-1,\tau)$, $a_5=(\tau,0,1)$, $a_6=(\tau,0,-1)$, and $\tau=(\sqrt{5}-1)/2$ the golden mean. The structure has twelve 5-fold, fifteen 3-fold and thirty 2-fold symmetry axes. The lattice points of the icosahedral structure are generated and a solid structure created by using equal length rods to connect points in pairs. The overall shape shown in FIG. 1a is a dodecahedron, so that each of the 12 outside faces is perpendicular to a 5-fold rotation axis.

Crystals are created with a stereolithography machine (model SLA-250 from 3D Systems®) that produces a solid plastic model by UV laser photopolymerization. The resolution is 0.1 mm lateral and 0.15 mm vertical. Both the icosahedral quasicrystal and diamond crystal have vertices connected with rods, of length $d=\sqrt{3}a/4=1$ cm. The rod diameter is 0.15 cm for the quasicrystal and 0.4 cm for the diamond structure. The quasicrystal has 694 cells, 4000 rods, and consists of 17.3% volume percent polymer whereas the diamond structure has 500 cells and is 7.36% polymer. The refractive index of the polymerized SLA5170 resin was measured by placing a solid block in a waveguide and recording the transmission and reflection spectrum. For 33 GHz microwaves ($\lambda$=0.91 cm in air), ñ=1.65−0.025i. The resulting (1/e) absorption length is 12 wavelengths. (The finite absorption from the polymer reduces the transmission approximately as exp(−2ω$\eta$L/c), where $\eta$□=0.025 is the imaginary part of the refractive index and L is the transmission path length. The actual attenuation will depend on the geometry and the modes. All curves in FIG. 2A-B have been multiplied by the same simple exponential factor to reduce the background slope. This has no effect on the gap determination.)

Example 2. Transmission Measurements

Transmission measurements for the icosahedral quasicrystal of FIG. 1a can be made with a HP Model 8510C Vector Analyzer in three bands, from 8 to 15, from 15 to 26 and from 26 to 42 GHz. To approximate plane waves, a single $TE_{10}$ mode is coupled through two sets of horn-attached waveguides with two custom-made polystyrene microwave lenses as schematically shown in the insert in FIG. 2A-B. Before the sample is put in, the transmission spectrum of the setup is recorded for normalization. Since the sample has different symmetry and dimensions in different directions, the transmission spectrum should be orientation and polarization sensitive. The sample is aligned so that the incident beam is perpendicular to one of the sample's rotational symmetry axes. The sample is rotated along that rotational symmetry axis, and the relative transmission spectrum is recorded, for example, every 2 degrees. For the quasicrystal, a rotation about the 2-fold axis covers all the external points of the irreducible Brillouin zone and both polarizations. The region covered by the rotation about the 2-fold (5-fold) axis is shown as the dotted (dashed) red line in FIG. 1c. In FIG. 2A-B, the measured transmission T(f,θ) for this rotation are shown in overlapping plots from two frequency bands.

Example 3. Holographic Optical Trapping

The foregoing photonic quasicrystal is macroscopic, however, this design can be miniaturized, e.g., for nanoparticles or other particles. For example, laser tweezers can be used for particle trapping or two-photon polymerization can be used. Such methods allow construction of a quasicrystalline matrix of dielectric components with a photonic bandgap in the visible.

Computer generated holograms are projected through a high-numerical-aperture microscope objective lens to create large three-dimensional arrays of optical traps. Light at 532 nm form a frequency-doubled diode-pumped solid state laser (Coheret Verdi) is imprinted with phase-only holograms using a liquid crystal spatial light modulator (SLM) (Hamamatsu X8267 PPM). The modified laser beam is relayed to the input pupil of a 100×NA 1.4 SPlan Apo oil immersion objective mounted in an inverted optical microscope (Nikon TE-2000U), which focuses it into traps. The same objective lens is used to form images of trapped objects using the microscope's conventional imaging train.

Colloidal silica microspheres (1.53 micrometers in diameter, Duke Scientific Lot 5238) dispersed in an aqueous solution of 180:12:1 (wt/wt) acrylamide, N, N'-methylenebisacrylamide, and diethoxyacetophenone (all Aldrich electrophoresis grade). This solution photopolymerizes into a transparent polyacrylamide hydrogel under ultraviolet illumination. Fluid dispersions were imbibed into 30 micrometer thick slit pores formed by bonding the edges of number 1 coverslips to the faces of glass microscope slides. The sealed samples were then mounted on the microscope's stage for processing and analysis.

Silica spheres are roughly twice as dense as water and sediment rapidly into a monolayer above the coverslip. A dilute layer of spheres is readily organized by holographic optical tweezers into two and three-dimensional quasicrystalline configurations. Holographic optical traps were used to create nonuniform architectures with specifically engineered features, e.g., a channel with a ninety-degree turn embedded in a quasiperidic pattern having 8-fold symmetry. The quasicrystals are gelled.

Example 4. Fabrication of Quasicrystals with Arbitrary Symmetry and Geometric Complexity In order to create quasicrystal photonic structures with arbitrary complexity and symmetry one uses a system to write a pattern directly in three dimensions. One uses a dye sensitized epoxy resist which will polymerize when exposed to sufficient light intensity. One uses a computer program to control a laser and associated optics to create spatial modulations of light intensity to write a quasicrystalline pattern. One directs the light to certain positions by focusing and scanning as with laser tweezers, or one broadly addresses a volume of said sensitized photopolymer by interfering two or more laser beams to create a modulated intensity pattern. One directly writes the quasicrystalline pattern with all its symmetry or one makes an exposure and then repeats the exposure after rotation of the light beam or the sample to provide the five fold, seven fold or higher fold symmetry required. One controls the polymerization in a two-step reaction (exposure and postexposure bake). The two-step process allows one to expose the entire material without distorting or perturbing the light paths. One then bakes the exposed material to allow solidification of the exposed regions. One completes the process by drainage of the underexposed liquid. This leaves a dielectric constant contrast between the photopolymer and the vacuum/air. One obtains different contrasts, or more gradual continuous variations in dielectric constant by back filling the void space with material of a different dielectric constant. One chooses a liquid material which diffuses into the photopolymer to create the more gradual or continuous dielectric variation. One adjusts the intensity of the light exposure to control the ability of the solid photopolymer to absorb the liquid and to swell to accommodate the liquid and locally provide an average dielectric constant between that of the photopolymer and the liquid. The controllable continuous dielectric constant results from the local exposure of the photopolymer and the amount of time the liquid is allowed to diffuse before it is solidified by heat or light treatment.

The polymerization is controlled in a two-step reaction (exposure and postexposure bake) without perturbing the interference patterns. We created a series of 2D and 3D defect-free porous structures with periods of 0.9-8-\micron in an area larger than 1-\unit{mm} by using visible-laser-initiated cationic polymerization of epoxides. Epon SU-8 s an epoxide abundant monomer with a 2,2'-((1-methylethylidene)bis(4,1-phenyleneoxymethylene))bis-oxirane structure.

The initiating system typically includes a photosensitizer, which absorbs the visible light and electron transfers to an onium salt via the formation of a charge-transfer complex to generate the acids. The photoacids initiate ring-opening reactions of epoxy groups and the acids are regenerated in the subsequent steps. The polymerization is thus chemically amplified, resulting in a highly cross-linked film. Two preferred photosensitizers include the xanthene dyes, 2,4,5,7-tetraiodo-6-hydroxy-3-fluorone and Rose Bengal.

The relatively high glass transition temperature of SU-8, 50° C., is desirable for minimizing the acid diffusion before the postexposure bake. Polymerization during exposure is not desired because it disturbs the original interference pattern because of the change of refractive index of the cross-linked film. When the film is exposed at room temperature and then baked, the beam interference stage is separated from the film cross-linking stage. Triethylamine (TEA) is in the resist. At the molar ratio of TEA/2,4,5,7-tetraiodo-6-hydroxy-3-fluorone of 0.03:1, respectively open holes were observed, indicating the neutralization of background acids and the resulting partial removal of the cross-linked background.

In a further example, one uses laser ablation for the synthesis of quasicrystals. One deposits films comprised of a preselected material onto a solid support and ablate via repetitive pulsing with a laser source such as a pulsed excimer laser. Riabinina et al. (2006) "Photoluminescent silicon nanocrystals by reactive laser ablation" *Applied Physics Letters* 88, Art. No. 073105.

Still another example one uses lithography to fabricate quasicrystals with the physical properties desired. One uses photomask lithography to introduce quasicrystals with the capability of phase-shifting electromagnetic radiation. Chang et al. (2006) "Fabrication of photonic bandgap structures with designed defects by edge diffraction lithography" *Nanotechnology* 17, 133-1338.

It will be appreciated by those skilled in the art that various omissions, additions and modifications may be made to the invention described above without departing from the scope of the invention, and all such modifications and changes are intended to fall within the scope of the invention, as defined by the appended claims. All references, patents, patent applications or other documents cited are herein incorporated by reference.

The invention claimed is:

1. A method comprising: a) providing a quasicrystalline composition comprising material elements in which waves are oriented in different directions; and b) arranging said material elements into a quasi-periodic pattern that modulates sound waves, wherein said quasicrystalline composition has at least a five-fold symmetry axis and not a six-fold symmetry axis; and said quasicrystalline composition is a dielectric heterostructure that exhibits a phononic band structure of corresponding symmetry, forbidden in crystals in a two- or three-dimensional space, and characterized by a complete band gap.

2. A device comprising a quasicrystalline composition comprising material elements in which waves are oriented in different directions, wherein said material elements are arranged in a quasi-periodic pattern that modulates sound waves, wherein said quasicrystalline composition has at least a five-fold symmetry axis and not a six-fold symmetry axis; and said quasicrystalline composition is a dielectric heterostructure that exhibits a phononic band structure of corresponding symmetry, forbidden in crystals in a two- or three-dimensional space, and characterized by a complete band gap, so as to produce the device.

* * * * *